(12) United States Patent
Kwag et al.

(10) Patent No.: US 8,993,876 B2
(45) Date of Patent: Mar. 31, 2015

(54) SOLAR CELL AND METHOD FOR MANUFACTURING THE SAME

(75) Inventors: Gyeayoung Kwag, Changwon-si (KR);
Haejong Cho, Changwon-si (KR);
Taeyoung Kwon, Changwon-si (KR);
Sungjin Kim, Changwon-si (KR);
Seongeun Lee, Changwon-si (KR)

(73) Assignee: LG Electronics Inc., Seoul (KR)

( * ) Notice: Subject to any disclaimer, the term of this patent is extended or adjusted under 35 U.S.C. 154(b) by 83 days.

(21) Appl. No.: 13/336,561

(22) Filed: Dec. 23, 2011

(65) Prior Publication Data

US 2012/0199190 A1 Aug. 9, 2012

(30) Foreign Application Priority Data

Dec. 28, 2010 (KR) .................. 10-2010-0136877

(51) Int. Cl.
*H01L 31/00* (2006.01)
*H01L 31/0224* (2006.01)

(52) U.S. Cl.
CPC ......... *H01L 31/022425* (2013.01); *Y02E 10/52* (2013.01); *H01L 31/022433* (2013.01)
USPC ....................................... 136/256

(58) Field of Classification Search
CPC .............................. H01L 31/022433
USPC ....................................... 136/256
See application file for complete search history.

(56) References Cited

U.S. PATENT DOCUMENTS

| 4,737,197 A * | 4/1988 | Nagahara et al. ............. 136/256 |
| 2008/0216893 A1* | 9/2008 | Russell et al. ................ 136/261 |
| 2009/0025782 A1* | 1/2009 | Ojima et al. .................. 136/255 |
| 2009/0260684 A1* | 10/2009 | You .............................. 136/256 |

FOREIGN PATENT DOCUMENTS

| JP | 2008-159794 A | 7/2008 |
| JP | 2010-027778 A | 2/2010 |
| KR | 10-2010-0055558 A | 5/2010 |
| KR | 10-2010-0132323 A | 12/2010 |

OTHER PUBLICATIONS

Korean Office Action dated Oct. 30, 2012, in Korean Application No. 10-2010-0136877.

* cited by examiner

*Primary Examiner* — James Lin
*Assistant Examiner* — Dujuan Horton
(74) *Attorney, Agent, or Firm* — Birch, Stewart, Kolasch & Birch, LLP

(57) ABSTRACT

A solar cell includes a silicon semiconductor substrate; an emitter layer formed on a surface of the silicon semiconductor substrate; an antireflection layer formed on the emitter layer: and a front electrode electrically connected to the emitter layer by penetrating the antireflection layer. The front electrode includes a finger line and a busbar electrode electrically connected to the finger line, and the busbar electrode includes at least a first electrode line and a second electrode line electrically connected to each other. The first and second electrode lines have a width same as or larger than a width of the finger line, and the first and second electrode lines have the width of 100 μm or less.

9 Claims, 6 Drawing Sheets

(a)

(b)

(c)

SOLAR CELL AND METHOD FOR MANUFACTURING THE SAME

CROSS-REFERENCE TO RELATED APPLICATION

This application claims priority to and the benefit of Korean Patent Application No. 10-2010-0136877, filed on Dec. 28, 2010 in the Korean Intellectual Property Office, the disclosure of which is incorporated herein by reference.

BACKGROUND OF THE INVENTION

1. Field of the Invention

Embodiments of the invention relate to a solar cell and a method for manufacturing the same, and more particularly, to a solar cell including a patterned front electrode and a method for manufacturing the same.

2. Description of the Related Art

Recently, as it is expected that conventional energy resource such as petroleum and coal will be exhausted, interest in alternative energy to replace the conventional energy resources is gradually increasing. Among them, a solar cell is spotlighted as a new generation cell using a semiconductor device for directly converting solar energy into electric energy.

In other words, a solar cell is a device converting the solar energy into the electric energy by using a photovoltaic effect. Solar cells can be classified into a crystal silicon solar cell, a thin-film solar cell, a dye-sensitized solar cell, and an organic solar cell. The crystal silicon solar cell is generally the most widely used. In the solar cell, it is important to improve an efficiency, which is defined as a ratio of generated electric energy to incident solar energy.

On the other hand, in a conventional silicon solar cell, a front electrode is formed by screen-printing a paste. However, for the front electrode formed by the screen printing, it is difficult to have a fine pattern, and the aspect ratio is low. Although a pattern formed by a gravure off-set printing may be smaller the pattern formed by the screen printing, a busbar electrode having a width larger than 100 μm is difficult to form by the gravure off-set printing. Therefore, when the front electrode is formed by the gravure off-set printing, an additional process for forming the busbar electrode is necessary after forming a finger line via the gravure off-set printing. Accordingly, the manufacturing process is complicate, and productivity is low.

SUMMARY OF THE INVENTION

Embodiments of the invention are directed to a solar cell including a finger line and a busbar electrode formed by off-set printing at the same time and a method for manufacturing the same.

A solar cell according to an embodiment of the invention includes a silicon semiconductor substrate; an emitter layer formed on a surface of the silicon semiconductor substrate; an antireflection layer formed on the emitter layer; and a front electrode electrically connected to the emitter layer by penetrating the antireflection layer. The front electrode includes a finger line and a busbar electrode electrically connected to the finger line, and the busbar electrode includes at least one first electrode line and at least one second electrode line electrically connected to each other. The first and second electrode lines have a width the same as or larger than a width of the finger line, and the first and second electrode lines have the width of 100 μm or less.

A method for manufacturing solar cell according to an embodiment of the invention includes a silicon semiconductor substrate; forming an emitter layer on a surface of the silicon semiconductor substrate; forming an antireflection layer on the emitter layer: and forming a front electrode electrically connected to the emitter layer by penetrating the antireflection layer. The front electrode includes a finger line and a busbar electrode electrically connected to the finger line, and the busbar electrode includes at least one first electrode line and at least one second electrode line electrically connected to each other. The first and second electrode lines have a width the same as or larger than a width of the finger line, and the first and second electrode lines have the width of 100 μm or less. The finger line and the busbar electrode are formed at the same time by an off-set printing.

DETAILED DESCRIPTION OF THE EMBODIMENTS

In the following description, it will be understood that when a layer or film is referred to as being "on" another layer or substrate, it can be directly on the other layer or substrate, or intervening layers may also be present. In the figures, the dimensions of layers and regions are exaggerated or schematically illustrated, or some layers are omitted for clarity of illustration. In addition, the dimension of each part as drawn may not reflect an actual size.

Hereinafter, embodiments of the invention will be described with reference to the accompanying drawings.

Figure 1:
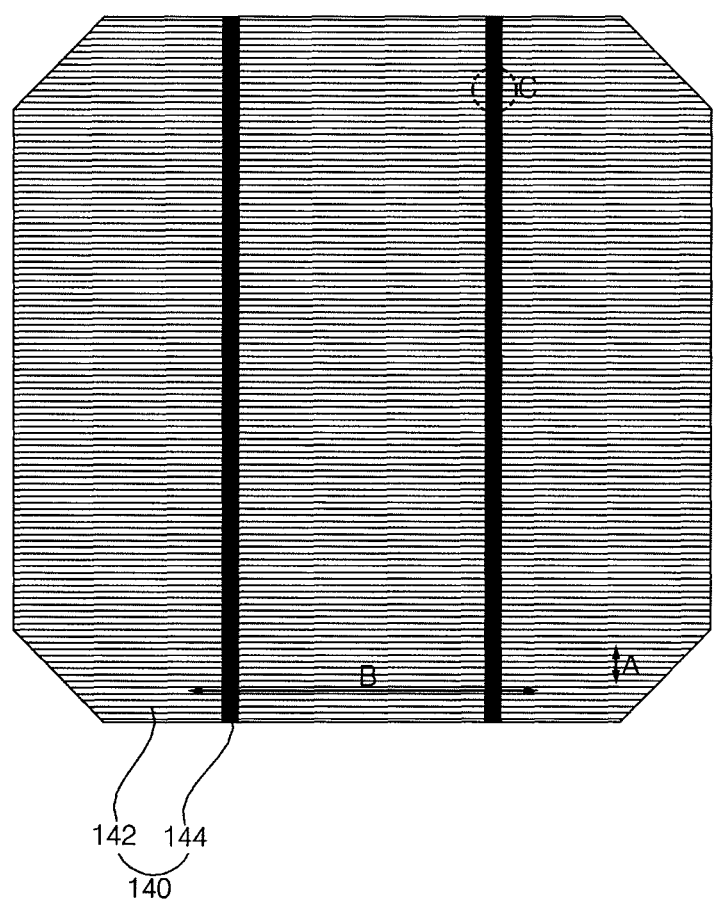
FIG. 1 is a plan view illustrating a solar cell according to an embodiment of the invention.
Figure 2:
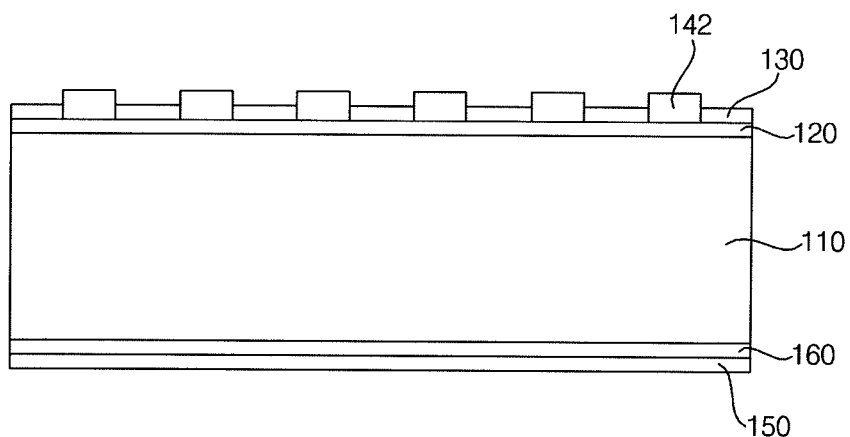
FIG. 2 is a cross-sectional view taken along line A of the solar cell shown in FIG. 1.
Figure 3:
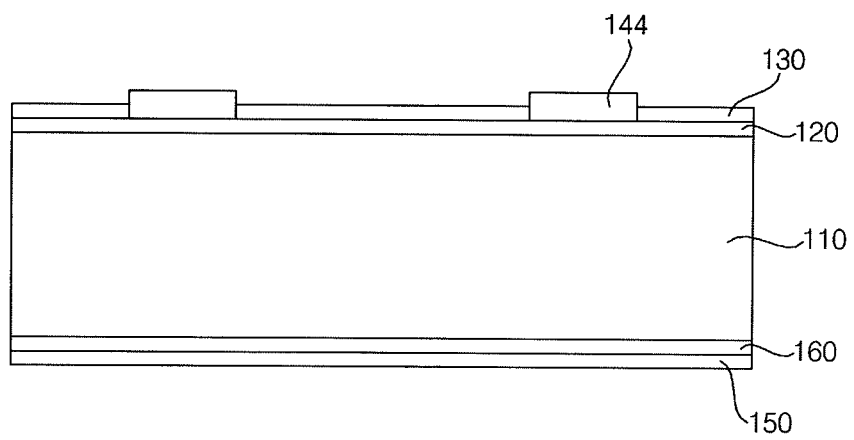
FIG. 3 is a cross-sectional view taken along line B of the solar cell shown in FIG. 1.
Figure 4:
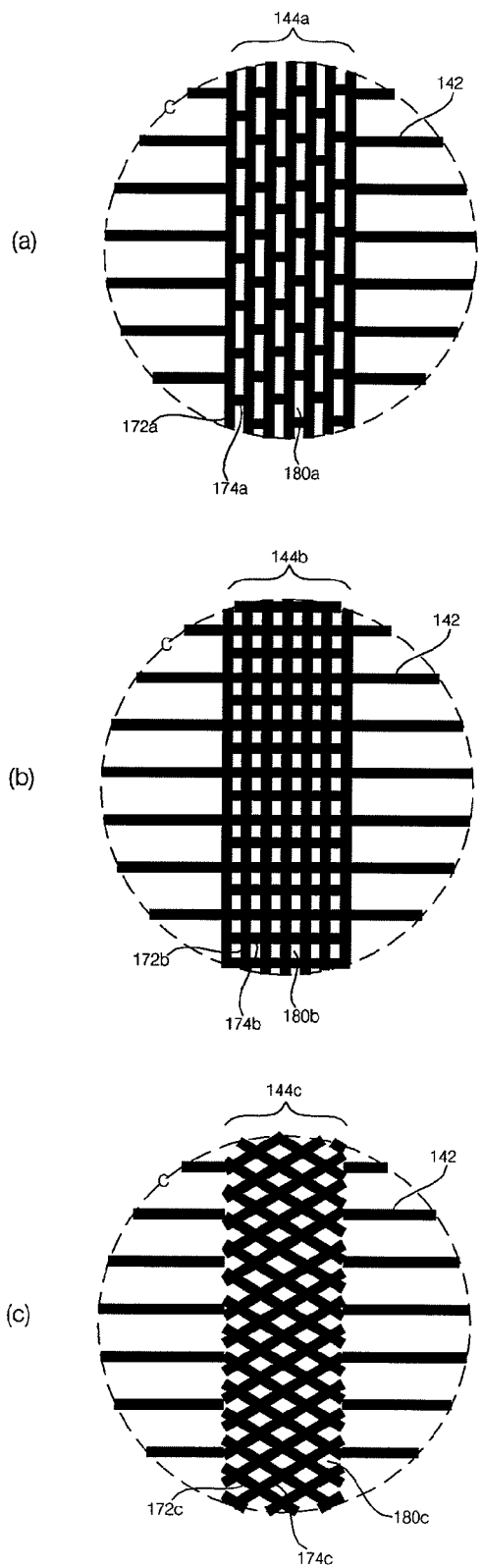
FIG. 4 illustrates enlarged views of portion C of the solar cell shown in FIG. 1.

FIG. 1 is a plan view illustrating a solar cell according to an embodiment of the invention. FIG. 2 is a cross-sectional view taken along line A of the solar cell shown in FIG. 1, and FIG. 3 is a cross-sectional view taken along line B of the solar cell shown FIG. 1. Also, FIG. 4 illustrates enlarged views of portion C of the solar cell shown in FIG. 1.

Referring to FIGS. 1 to 4, a solar cell 100 according to an embodiment of the invention includes a silicon semiconductor substrate 110, an emitter layer 120 formed on a surface of the silicon semiconductor substrate 110, an antireflection layer 130 formed on the emitter layer 120, and a front electrode 140 electrically connected to the emitter layer 120 by penetrating through the antireflection layer 130.

The silicon semiconductor substrate 110 may be made of silicon and may be doped with a P type dopant. For example, silicon may be doped with a dopant of a group III element such as B, Ga, and In.

The emitter layer 120 may be doped with a dopant of a group V element such as P, As, and Sb. The emitter layer 120 may be formed by a diffusion method, a spray method, or a printing method. For example, the emitter layer 120 may be formed by ion-implanting an N type dopant to the silicon semiconductor substrate 110 of the P type.

As noted above, when the emitter layer 120 and the silicon semiconductor substrate 110 are doped with dopants of different conductive types, a P-N junction is formed at an interface between the emitter layer 120 and the silicon semiconductor substrate 110. Then, electric energy is generated by a photoelectric effect when light (such as sun light) is incident to the P-N junction.

The antireflection film 130 is formed on the emitter layer 120. The antireflection film 130 reduces reflectance (or reflectivity) of sun light incident to a front surface of the substrate 110. The antireflection film 130 passivates defects at a surface or a bulk of the emitter layer 120.

Since the reflectance of the sun light is reduced by the antireflection film 130, an amount of the sun light reaching the P-N junction is increased, thereby increasing short circuit current (Isc) of the solar cell 100. Also, because the defects at the emitter layer 120 are passivated, recombination sites of minority carrier are reduced or eliminated, thereby increasing an open-circuit voltage (Voc) of the solar cell 100. Accordingly, the open-circuit voltage (Voc) and the short-circuit current (Isc) of the solar cell 100 are increased by the antireflection layer 130, and thus, the efficiency of the solar cell 100 can be enhanced.

The first anti-reflection film 130 may have a single film structure or a multi-layer film structure including at least one material selected from the group consisting of silicon nitride, silicon nitride including hydrogen, silicon oxide, silicon oxy nitride, $MgF_2$, ZnS, $TiO_2$ and $CeO_2$. Other materials may be used.

Meanwhile, the light-incident surface of the silicon semiconductor substrate 110 may be a textured surface. By a texturing of the surface (the light incident surface), a dented-protruded pattern is formed at the surface of the silicon semiconductor substrate 110. When the substrate 110 is textured, the emitter layer 120 and the antireflective film 130 may be formed according to the textured shape. Thus, the reflectance of the incident sun light can be reduced, thereby reducing an optical loss of the solar cell 100.

The front electrode 140 is electrically connected to the emitter layer 120 by penetrating through the antireflection layer 130, and includes a finger line 142 and a busbar electrode 144 electrically connected to the finger line 142.

The finger line 142 may collect electrons or holes generated by the solar cell 100. The bus bar electrode 144 electrically connected to the finger line 142 is a portion where a ribbon is attached during a modularization of a plurality of solar cells 100 in order to transmit the electrons or the holes to the outside.

Figure 5:
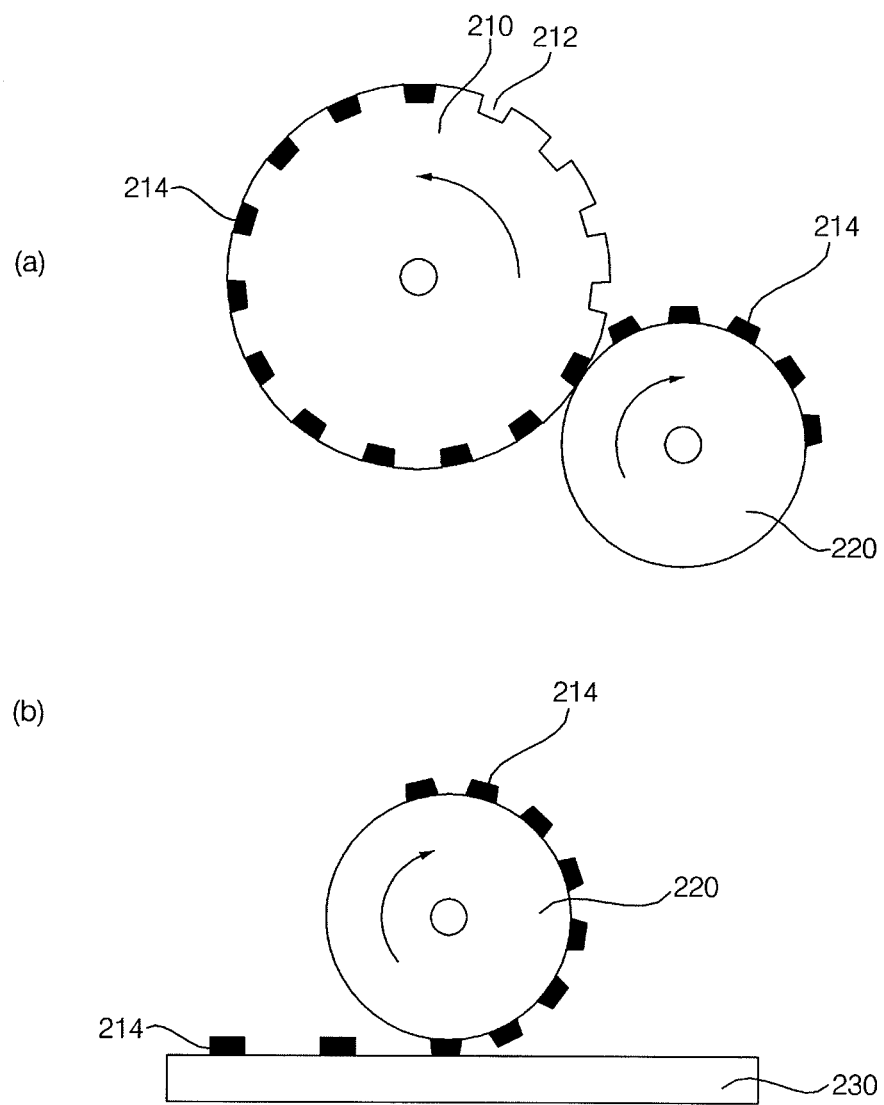
FIG. 5 illustrates a method for manufacturing a front electrode included in a solar cell according to an embodiment of the invention.

The finger line 142 and the busbar electrode 144 may be simultaneously formed by an off-set printing (particularly, by a gravure off-set printing shown in FIG. 5). In order to achieve this, the busbar electrode 144 may have a pattern.

The conventional busbar electrode generally has a width larger than 1 mm and smaller than 3 mm. Thus, it is difficult to form the conventional busbar electrode by the off-set printing (particularly, the gravure off-set printing) suitable for forming a fine pattern. Thus, in the embodiment, as shown in FIG. 4, the busbar electrode 144 (i.e., 144a, 144b, 144c) has a pattern including a first electrode line 172 (i.e., 172a, 172b, 172c) and a second electrode line 174 (i.e., 174a, 174b, 174c). Then, the finger line 142 and the busbar electrode 144 can be simultaneously formed by the gravure off-set printing.

FIG. 4 illustrates various patterns formed by the first electrode line 172 and the second electrode line 174.

First, referring to (a) of FIG. 4, the first electrode line 172a and the second electrode line 174a cross each other in order to form a pattern, and provide a pathway where the current flows. In this instance, the first electrode line 172a is perpendicular to the finger line 142a, and includes a plurality of first electrode lines 172a spaced apart from each other. The second electrode line 174a is parallel to the finger line 142a, and includes a plurality of second electrode lines 174a connect the plurality of the first electrode lines 172a in order to act as bridge electrodes.

In (a) of FIG. 4, the second electrode line 174a and the first electrode line 172a are perpendicular to each other. However, the embodiment is not limited thereto. The second electrode line 174a may be formed in various directions so that it can be connected to the first electrode line 172a. That is, the second electrode line 174a has various shapes such as a V shape.

Referring to (b) and (c) of FIG. 4, the pattern formed by the first electrode line 172 and the second electrode line 174 may be a matrix pattern. In (b) of FIG. 4, the matrix pattern is formed by the first electrode line 172b and the second electrode line 174b to be perpendicular to each other. In (c) of FIG. 4, the first electrode line 172c and the second electrode line 174c are inclined in order to form a diaper shape (or a trellis shape). However, the embodiment is not limited thereto. Thus, the first electrode line 172 and the second electrode line 174 may be inclined to form a triangular shape. As such, when the first electrode line 172 and the second electrode line 174 form a uniform matrix pattern, the manufacturing process can be simplified.

Meanwhile, the first electrode line 172 and the second electrode line 174 may have a width that is the same as or larger than a width of the finger line 142. The first electrode line 172 and the second electrode line 174 may have the width of about 100 μm or less so that the property of the pattern formed by the gravure off-set printing can be improved. For example, the first electrode line 172 and the second electrode line 174 may have the width of about 30 to 100 μm, and the finger line 142 may also have a width of about 30 to 100 μm.

Therefore, the finger line 142 and the busbar electrode 144 can be simultaneously formed by the gravure off-set printing. Accordingly, the manufacturing process can be simple, and the productivity of the solar cell 100 can be improved.

The front electrode 140 has a fine pattern, and thus, the front electrode 140 has a high aspect ratio. Accordingly, the efficiency of the solar cell 100 can be enhanced. For example, the finger line 142, and the first electrode line 172 and the second electrode line 174 of the busbar electrode 144 formed by the gravure off-set printing may have the width of about 30 to 100 μm, and may have a thickness of about 30 to 50 μm. Thus, the aspect ratio may be about 0.3 to 1.6. In this instance, the aspect ratio may be about 0.3 to 1.0 since the aspect ratio larger than about 1.0 is difficult to achieve.

Referring to FIG. 4 again, the plurality of first electrode lines 172 and the plurality of second electrode lines 174 of the busbar electrode 144 for forming the matrix pattern cross each other so that the current can flow. At a portion where the plurality of first electrode lines 172 and the plurality of second electrode lines 174 are not formed, voids 180 (i.e., 180a, 180b, 180c) are formed. Due to the voids 180, the amount of the paste for forming the busbar electrode 144 can be saved, and thus, the manufacturing cost can be reduced.

However, a void fraction that is a ratio of the voids 180 to the whole portion of the busbar electrode may be about 50% or less. When the void fraction is larger than 50%, the resistance of the busbar electrode 144 may increase, and thus, fill factor may decrease.

Referring to FIGS. 1-3 again, the solar cell 100 according to the embodiment of the invention may include a rear electrode 160 formed on the other surface (or a back surface) of the silicon semiconductor substrate 110 and a back surface field layer 165 formed between the rear electrode 160 and the silicon semiconductor substrate 110.

The rear electrode 160 may be formed by printing a paste for forming the rear electrode 160 on the silicon semiconductor substrate 110 and heat-treating the same. When the paste for the rear electrode 160 is heat-treated, aluminum of the paste for the rear electrode 160 is diffused through the rear surface of the substrate 110, and the back surface field layer 165 is formed between the rear electrode 160 and the substrate 110.

The back surface field layer 165 reduces or prevents recombination of carriers at the rear surface of the substrate 110, and thereby increases the open-circuit voltage. Accordingly, the efficiency of the solar cell 100 can be enhanced.

FIG. 5 is a view illustrating a method for manufacturing a front electrode included in a solar cell according to an embodiment of the invention. FIG. 5 illustrates the gravure off-set printing process. The gravure off-set printing process will be described with reference to FIG. 5. Referring to (a) of FIG. 5, concave portions 212 having a shape opposite (or negative) to the shape of the front electrode 140 are formed on the surface of a gravure cylinder 210. First, a paste 214 for forming the front electrode 140 is filled in the concave portions 212.

The paste 214 may include a silver powder, glass fit, a binder, and a solvent. For example, the paste 214 may include about 60 to 85 wt % of the silver powder, about 3 to 20 wt % of the glass fit, about 2 to 15 wt % of the binder, and about 5 to 20 wt % of the solvent. However, the embodiment is not limited thereto, and other various pastes may be used. Relatively high viscosity is needed for the paste for the gravure off-set printing process, compared to the conventional screen printing. Thus, the binder of the paste for the gravure off-set printing has a relatively high glass transition temperature (Tg), compared to the conventional screen printing.

The paste 214 filled in the concave portions 212 is in contact with a blanket 220, and is transferred to the blanket 220. The gravure cylinder 210 and the blanket 230 continuously rotate while being in contact with each other, so that the paste 214 filled in the concave portions 212 can be continuously transferred to the blanket 220. Thus, the transferred pattern 214 on a surface of the blanket 220 has a shape of the front electrode 140 including the finger line 142 and the bulbar electrode 144 with the matrix pattern, for example.

Next, as shown in (a) of FIG. 5, the pattern 214 transferred to the surface of the blanket 220 is printed on the antireflection layer 230. After the blanket 220 is in contact with the antireflection layer 230, the blanket 220 is rotated. Also, the silicon semiconductor substrate where the antireflection layer 230 is formed may be moved or the blanket 220 may be moved. Then, the paste 214 having the shape of the front electrode 140 can be transferred on to the antireflection layer 230.

The fine pattern can be achieved by the above gravure off-set printing, and the front electrode 140 can have a high aspect ratio. In addition, since the busbar electrode 144 is simultaneously formed with the finger line 142, the manufacturing process can be simple and the productivity can be improved.

Meanwhile, the gravure off-set printing is exemplified in the above description and FIG. 5. However, the front electrode 140 may be formed by an off-set printing where the paste 214 filled in the concave portions 212 of the gravure cylinder 210 is directly transferred on the antireflection layer 230.

Figure 6:
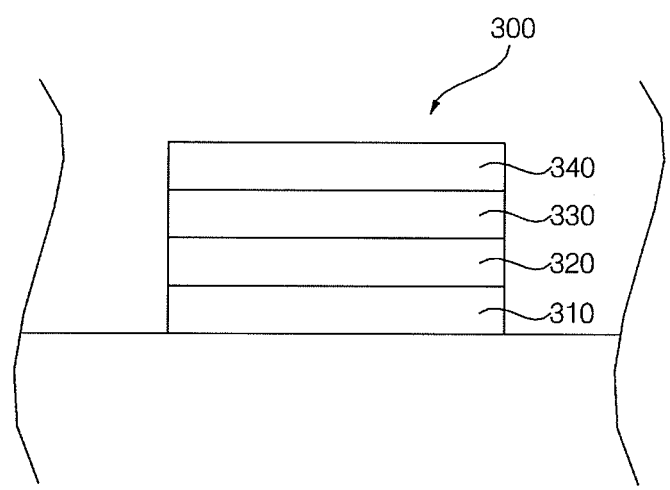
FIG. 6 is a cross-sectional view illustrating a front electrode included in a solar cell according to an embodiment of the invention.

FIG. 6 is a cross-sectional view illustrating a front electrode included in a solar cell according to an embodiment of the invention. The front electrode 300 of FIG. 6 may be the finger line 142 or the busbar electrode 144 of FIG. 1. According to the embodiment, the finger line 142 and the busbar electrode 144 are formed at the same time, and thus, have the same shape. Accordingly, the front electrode 300 is used without making a distinction between the finger line 142 and the busbar electrode 144.

Referring FIG. 6, the front electrode 300 may include at least two layers from among the layers 310, 320, 330, and 340. That is, the front electrode 300 may be formed by at least two-times gravure off-set printing or at least two applications of the gravure off-set printing.

The uppermost layer 340 of the front electrode 300 is less involved in a fire through for penetrating the antireflection layer 130 than the undermost layer 310. Thus, the amount of the glass frit in the uppermost layer 340 may be smaller than the amount of the glass frit in the layer 330, the amount of the glass frit in the layer 330 may be smaller than the amount of the glass frit in the layer 320, and the amount of the glass frit in the layer 320 may be smaller than the amount of the glass fit in the undermost layer 310.

On the contrary, the amount of the silver in the uppermost layer 340 may be larger than the amount of the silver in the layer 330, the amount of the silver in the layer 330 may be larger than the amount of the silver in the layer 320, and the amount of the silver in the layer 320 may be larger than the amount of the silver in the undermost layer 310. Accordingly, the total resistance of the front electrode 300 can be reduced, and the fill factor of the solar cell can be enhanced.

Figure 7:
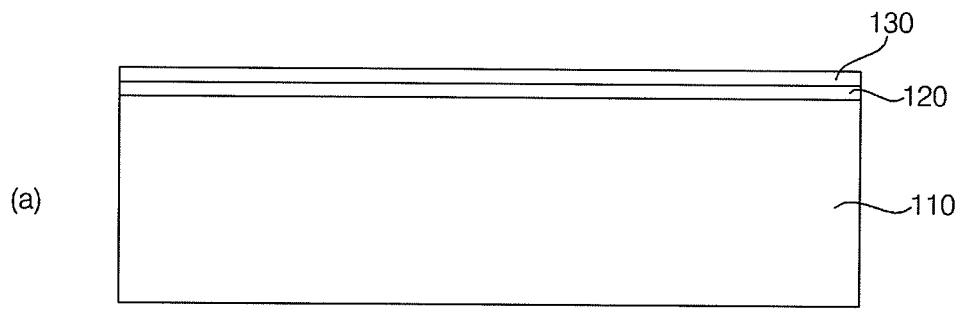
FIG. 7 illustrates a method for manufacturing a solar cell according to an embodiment of the invention.
Figure 7:
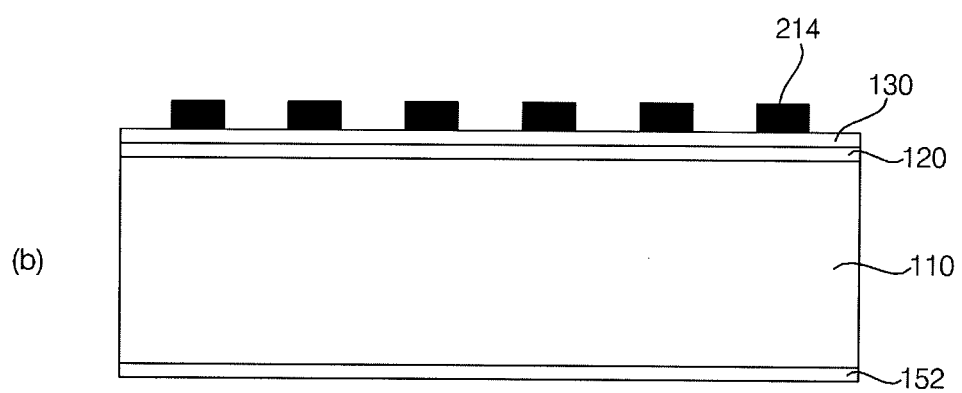
Figure 7:
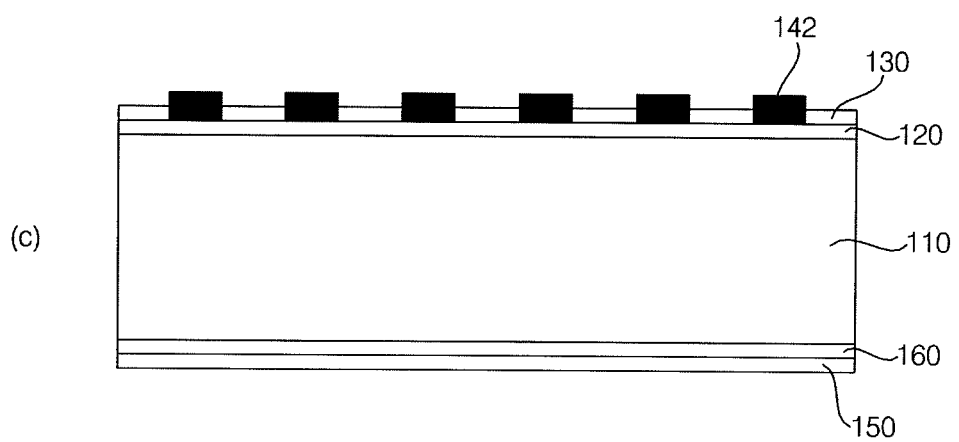

FIG. 7 is a view illustrating a method for manufacturing a solar cell according to an embodiment of the invention. In the following description, FIG. 1 is also referred to. In a method for manufacturing a solar cell 100, an emitter layer 120 and an antireflection layer 130 are sequentially formed on a silicon semiconductor substrate 110, as shown in (a) of FIG. 7.

The emitter layer 120 may be formed by a diffusion method, a spray method, or a printing method. For example, the emitter layer 120 may be formed by ion-implanting of the N type dopant to the silicon semiconductor substrate 110 of the P type. The antireflection layer 130 may be formed by a vacuum evaporation, a chemical vapor deposition, a spin coating, a screen printing, or a spray coating.

Meanwhile, dented-protruded patterns (protrusion and depression patterns) may be formed at a surface of the silicon semiconductor substrate 110 where the emitter layer 120 and the antireflection layer 130 are sequentially formed. The dented-protruded patterns may be formed by a wet etching, a laser etching, or a reactive ion etching. The dented-protruded patterns may have various shapes such as a pyramid, a square, or a triangle.

Next, as shown in (b) of FIG. 7, the paste 214 for forming the front electrode 140 is printed on the antireflection layer 130. The paste 214 may be formed by the off-set printing (particularly, the gravure off-set printing). Since the busbar electrode 144 has the matrix pattern, the bus electrode 144 as well as the finger line 142 of the front electrode 140 can be formed by the off-set printing. Thus, the finger line 142 and the bus electrode 144 can be simultaneously printed. Therefore, the front electrode 140 can have a high aspect ratio. Also, the manufacturing process can be simple and the productivity can be enhanced.

Also, since the matrix pattern has the voids 180, the amount of the paste for forming the busbar electrode 144 can be reduced. However, the void fraction of the busbar electrode 144 may be about 50% or less, considering the resistance of the busbar electrode 144.

In addition, the off-set printing may be performed two times or more, and the front electrode 140 may include two or more layers. The pastes 214 for the off-set printing of the front electrode 140 may have the same compositions or different compositions. For example, in the front electrode 140, the amount of the glass frit may decreases, as the distance from the emitter layer 120 increases. Thus, the resistance of the front electrode 140 can decrease, and the aspect ratio of the front electrode 140 can increase more.

The paste 152 for the rear electrode 150 including aluminum, quartz silica, and a binder is printed on the rear surface of the silicon semiconductor substrate 110 in order to form the rear electrode 150.

Next, as shown in (c) of FIG. 7, the front electrode 140 and the rear electrode 150 are formed by the heat treatment. When the paste 214 for the front electrode 140 is heat-treated, the silver included in the paste 214 for forming the front electrode 140 is liquefied at a high temperature, and then, is solidified by recrystallization. During the process, the antireflection layer 130 is penetrated by a fire-through phenomenon using the glass frit, and the front electrode 140 is electrically connected to the emitter layer 120.

When the paste 152 for the rear electrode 160 is heat-treated, the aluminum of the paste 152 for the rear electrode 160 is diffused through the rear surface of the substrate 110, and the back surface field layer 165 is formed between the rear electrode 160 and the substrate 110. The back surface field layer 165 reduces or prevents recombination of electrons or holes generated from the sun light, thereby increasing the efficiency of the solar cell 100.

Certain embodiments of the invention have been described. However, the invention is not limited to the specific embodiments described above; and various modifications of the embodiments are possible by those skilled in the art to which the invention belongs without leaving the scope of the invention defined by the appended claims. Also, modifications of the embodiments should not be understood individually from the technical principles or prospects of the invention.

What is claimed is:

1. A solar cell, comprising:
a silicon semiconductor substrate;
an emitter layer formed on a surface of the silicon semiconductor substrate;
an antireflection layer formed on the emitter layer; and
a front electrode electrically connected to the emitter layer by penetrating through the antireflection layer,
wherein the front electrode comprises a finger line and a busbar electrode electrically connected to the finger line,
the busbar electrode comprises at least one first electrode line and at least one second electrode line electrically connected to each other,
each of the first electrode line and the second electrode line extends in a direction inclined with the finger line, wherein the first electrode line and the second electrode line cross each other,
the first and second electrode lines have a width the same as or larger than a width of the finger line, and
the first and second electrode lines have the width of 100 µm or less.

2. The solar cell according to claim 1, wherein the first electrode line includes a plurality of first electrode lines spaced apart from each other, and
the second electrode line includes a plurality of second electrode lines spaced apart from each other.

3. The solar cell according to claim 1, wherein the first electrode line and the second electrode line form a matrix pattern.

4. The solar cell according to claim 1, wherein a portion of the busbar electrode where the first and second electrode lines are not formed forms a void, and
the busbar electrode has a void fraction of 50% or less.

5. The solar cell according to claim 1, wherein the front electrode includes at least two layer having different compositions.

6. The solar cell according to claim 1, wherein the front electrode includes a first layer on the emitter layer and a second layer on the first layer, and
an amount of glass frit of the second layer of the front electrode is smaller than that of the first layer.

7. The solar cell according to claim 1, wherein the finger line, the first electrode line, and the second electrode line have widths of about 30 µm to about 100 µm.

8. The solar cell according to claim 1, wherein the at least one first electrode line includes a plurality of first electrode lines, the at least one second electrode line includes a plurality of second electrode lines, and the finger line includes a plurality of finger lines,
a spacing between the plurality of first electrode lines is less than a spacing between the plurality of finger lines, and
a spacing between the plurality of second electrode lines is less than the spacing between the plurality of finger lines.

9. The solar cell according to claim 1, wherein the first electrode line and the second electrode line are inclined to each other.

* * * * *